(12) United States Patent
Matsushiro

(10) Patent No.: US 6,661,351 B1
(45) Date of Patent: Dec. 9, 2003

(54) RADIO CONTROL SYSTEM AND RADIO CONTROL METHOD

(75) Inventor: Yukio Matsushiro, Chiba (JP)

(73) Assignee: CCP Co., Ltd., Tokyo (JP)

( * ) Notice: Subject to any disclaimer, the term of this patent is extended or adjusted under 35 U.S.C. 154(b) by 467 days.

(21) Appl. No.: 09/618,257

(22) Filed: Jul. 18, 2000

(51) Int. Cl.[7] .......................... G08C 19/00; B62D 1/24; A63H 30/04; A63F 9/24
(52) U.S. Cl. ................. 340/825.69; 180/168; 180/169; 446/456; 463/39
(58) Field of Search .................. 340/825.69, 825, 340/825.57, 825.62, 10.2; 446/456; 463/1, 36, 39; 180/167, 168, 169

(56) References Cited

U.S. PATENT DOCUMENTS

| | | | | |
|---|---|---|---|---|
| 3,639,755 A | * | 2/1972 | Wrege | 246/187 B |
| 4,334,221 A | * | 6/1982 | Rosenhagen et al. | 463/6 |
| 4,703,359 A | * | 10/1987 | Rumbolt et al. | 348/734 |
| 4,938,483 A | * | 7/1990 | Yavetz | 463/5 |
| 5,243,430 A | * | 9/1993 | Emmons | 348/734 |
| 5,713,783 A | * | 2/1998 | Szoke et al. | 446/456 |
| 5,885,159 A | * | 3/1999 | DeAngelis | 463/39 |

FOREIGN PATENT DOCUMENTS

JP 2000-51541 2/2000

* cited by examiner

Primary Examiner—Brian Zimmerman
Assistant Examiner—Clara Yang
(74) Attorney, Agent, or Firm—Baker & McKenzie

(57) ABSTRACT

The same ID is assigned to a pair of a plurality of transmitters 100 and RC cars 200. The transmitter 100 transmits a radio wave signal embodying command signal defining movement of a target RC car 200, and ID indicating the target RC car 200. The RC car 200 receives the radio wave signal, and is driven in accordance with the command signal embodied in the received radio wave signal when the ID in the received radio wave signal coincides with the receiver's ID.

15 Claims, 8 Drawing Sheets

RADIO CONTROL SYSTEM AND RADIO CONTROL METHOD

BACKGROUND OF THE INVENTION

1. Field of the Invention

The present invention relates to a radio control system wherein a transmitter transmits radio wave to control a device having a radio receiver.

2. Description of the Related Art

One of applications using the radio control system is for controlling radio controlled cars (RC cars). Allowable radio bands for the RC car are limited (for example, 27 MHz band and 40 MHz band). Each band should be divided into a plurality of sub bands (for example, 12 sub bands) in order to control a plurality of RC cars simultaneously. In this case, the sub bands are assigned to a pair of a transmitter and an RC car one by one, thus, the number of controllable RC cars is 12 at maximum.

The conventional radio control system allows only one RC car par one frequency band, thus, the number of simultaneously controllable RC cars is limited.

SUMMARY OF THE INVENTION

It is an object of the present invention to control a plurality of target receivers with a plurality of sub bands resulting from dividing one frequency band.

To achieve the above object, a radio control system according to a first aspect of the present invention is a system having pluralities of transmitters and receivers, wherein each of the transmitters comprises:

input means for inputting a command signal in accordance with the user's operation;

target designation means for designating target ID information which specifies a target receiver;

mode select means for selecting one of plural transmission modes in accordance with the target ID information; and transmission means for transmitting a radio wave signal representing the target ID information and the command signal in accordance with the selected transmission mode, each of the receivers comprises:

drive means for movably driving the receiver;

reception means for receiving the radio wave signal;

receiver designation means for designating receiver ID information which specifies the receiver itself;

extraction means for extracting the target ID information and the command signal from the radio wave signal received by the reception means; and signal conversion means for discriminating whether the extracted target ID information coincides with the receiver ID information, and for converting the extracted command signal into a drive signal if the coincidence is found; and drive control means for driving the drive means in accordance with the drive signal.

To achieve the above object, a radio control system according to a second aspect of the present invention is a system having pluralities of transmitters and receivers, wherein each of the transmitters comprises:

carrier wave generation means for generating a carrier wave signal corresponding to one of plurality frequency bands;

input means for inputting a command signal in accordance with the user's operation;

target designation means for designating target ID information which specifies a target receiver;

mode select means for selecting one of plural transmission modes in accordance with the target ID information;

first signal conversion means for converting the target ID information and the command signal into a modulation signal in accordance with the selected modulation signal; and transmission means for transmitting a radio wave signal resulting from modulating the carrier wave signal by the modulation signal, the each of the receivers comprises:

drive means for movably driving the receiver;

reception means receiving a radio wave signal corresponding to one of plural frequency bands;

receiver designation means for designating receiver ID information which identifies the receiver itself;

demodulation means for demodulating the radio wave signal received by the reception means to extract the target ID information and the command signal;

second signal conversion means for converting the extracted command signal into a drive signal when the extracted target ID information coincides with the receiver ID information; and drive control means for controlling the drive means in accordance with the drive signal.

The transmission mode may designate a cycle for intermittent transmission which differs in accordance with the target ID information, and the mode selection means may select a transmission mode which designates a cycle corresponding to the target ID information designated by the target designation means.

The first signal conversion means may compress the command signal and the target ID information before carrying out the signal conversion.

The target designation means may output drive type information which designates a type of the drive means of the target receiver, and the first signal conversion means may convert the command signal into the modulation signal in accordance with the drive type information.

The second signal conversion means may convert the extracted command signal into the drive signal in accordance with the drive type information included in the command signal.

The target designation means and the receiver designation means may be operable by a user to designate the target ID information and the receiver ID information.

According to the above structure, a plurality of target receivers according to one sub band resulting from dividing a specific frequency band are distinguished by ID, and the transmitters transmit radio wave signals which correspond to the sub band but differ from each other by the ID. This structure allows plural receiver control with using one frequency band.

The achieve the above object, a radio control method according to a third aspect of the present invention is a method comprising the steps of:

inputting a command signal in accordance with the user's operation;

designating target ID information which specifies a target receiver;

selecting one of plural transmission modes in accordance with the target ID information;

transmitting a radio wave signal representing the target ID information and the command signal;

receiving the radio wave signal whose transmission mode corresponds to receiver ID information assigned to a receiver, and extracting the target ID information and the command signal included in the received radio wave signal;

converting the extracted command signal into a drive signal when the extracted target ID information coincides with the receiver ID information; and executing actions in accordance with the drive signal.

To achieve the above object, a radio control method according to a fourth aspect of the present invention is a method comprising the steps of:

generating a carrier wave signal corresponding to one of plural frequency bands;

inputting a command signal in accordance with the user's operation;

designating target ID information which specifies a target receiver;

selecting one of plural transmission modes in accordance with the target ID information;

converting the target ID information and the command into a modulation signal in accordance with the selected transmission mode;

modulating the carrier wave signal by the resultant modulates signal to embody the target ID information and the command signal in a radio wave signal, and transmitting the radio wave signal;

receiving the radio wave signal corresponding to a specific frequency band;

designating receiver ID information which identifies a receiver;

demodulating the received radio wave signal to extract the target ID information and the command signal;

converting the extracted command signal into a drive signal when the extracted target ID information coincides with the receiver ID information; and driving the target receiver in accordance with the drive signal.

The transmission mode may designate a cycle for intermittent transmission which differs in accordance with the target ID information, and the mode selecting step may select transmission mode which designates a cycle corresponding to the target ID information designated by the target designating step.

The step of converting the command signal and the target ID information may compress the command signal and the target ID information before the conversion.

The target ID information designating step may output drive type information which designates drive type of the target receiver, and the step of converting the command signal may convert the command signal in accordance with the set drive type information.

The step of converting the extracted command signal may convert the extracted command signal into the drive signal in accordance with the drive type information included therein.

The steps of designating the target ID information and the receiver ID information may designate the target ID information and the receiver ID information in accordance with the user's operation.

According to the above structure, a plurality of target receivers according to one sub band resulting from dividing a specific frequency band are distinguished by ID, and the transmitters transmit radio wave signals which correspond to the sub band but differ from each other by the ID. This structure allows plural receiver control with using one frequency band.

To achieve the above object, a transmitter according to a fifth aspect of the present invention is a transmitter for a radio control system having a plurality of transmitters and receivers assigned to the transmitters respectively, comprising:

input means for inputting a command signal in accordance with the user's operation;

target designating means for designating target ID information which specifies a target receiver;

mode select means for selecting one of plural transmission modes in accordance with the target ID information; and transmission means for transmitting a radio wave signal representing the target ID information and the command signal, in accordance with the selected transmission mode.

To achieve the above object, a receiver according to a sixth aspect of the present invention is a receiver for a radio control system having pluralities of transmitters and receiver, comprising:

drive means for movably drives the receiver;

reception means for receiving a radio wave signal;

receiver designation means for designating receiver ID information which identifies the receiver itself;

demodulation means for extracting target ID information and a command signal included in a radio wave signal received by the reception means;

signal conversion means for discriminating whether the extracted target ID information coincides with the receiver ID information, and for converting the extracted command signal into a drive signal when the coincidence is found; and drive control means for controlling the drive means in accordance with the drive signal.

To achieve the above object, a controller according to a seventh aspect of the present invention is a controller for a radio control system having pluralities of transmitters and receivers, comprising:

carrier wave generation means for generating a carrier wave signal corresponding to one of plural frequency bands;

input means for inputting a command signal in accordance with the user's operation;

target designation means for designating target ID information which specifies a target receiver;

mode select means for selecting one of plural transmission modes in accordance with the target ID information;

signal conversion means for converting the target ID information and the command signal into a modulation signal in accordance with the selected transmission mode; and transmission means for transmitting a radio wave signal resulting from modulating the carrier wave signal by the modulation signal.

To achieve the above object, a receiver according to an eighth aspect of the present invention is a receiver for a radio control system having pluralities of transmitters and receivers, comprising:

drive means for movably driving the receiver, reception means for receiving a radio wave signal corresponding to one of plural frequency bands;

receiver designation means for designating receiver ID information which identifies the receiver itself;

demodulation means for extracts target ID information and a command signal included in the radio wave signal received by the reception means by demodulation;

signal conversion means for converting the extracted command signal into a drive signal when the extracted target ID information coincides with the receiver ID information; and drive control means for controlling the drive means in accordance with the drive signal.

DETAILED DESCRIPTION OF THE PREFERRED EMBODIMENTS

An embodiment of the present invention will now be described with reference to accompanying drawings.

Figure 1:
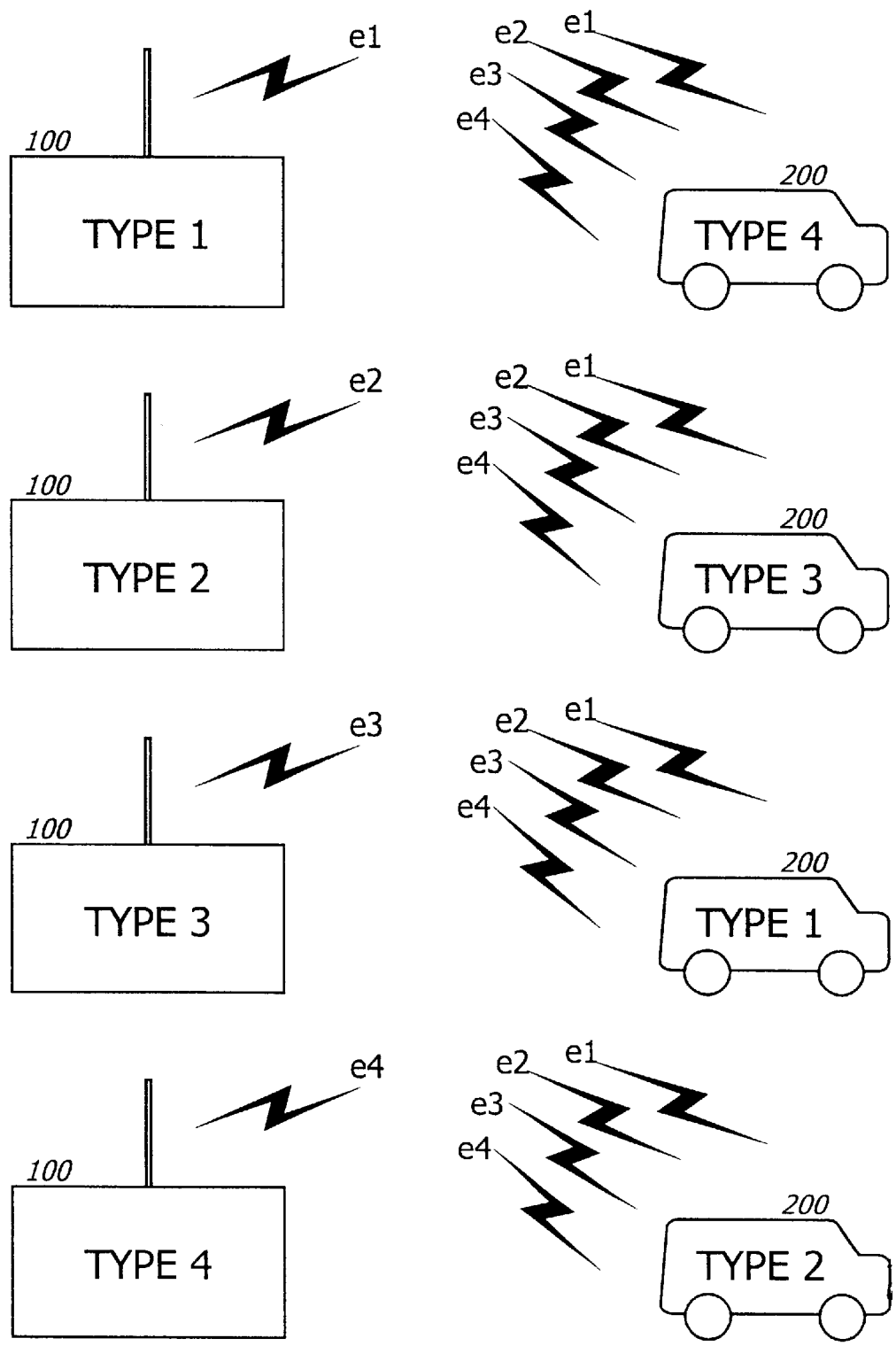
FIG. 1 is a diagram schematically showing the structure of a radio control system according an embodiment of the present invention.

FIG. 1 shows the structure of a radio control system according to the embodiment. Each of a plurality of transmitters 100 command signal with a carrier wave signal corresponding to one resultant sub band after dividing a specific band (for example, 27 MHz band) by into 12 sub bands. There are four ID types (type 1 to type 4) for classifying target receivers, and any one of them is assigned to each transmitter 100. Each transmitter 100 transmits a radio wave signal in any one of transmission modes e1, e2, e3, and e4 corresponding to the assigned ID.

RC (Radio Controlled) cars 200 as target receivers are associated with the transmitters 100 respectively. Each RC car 200 comprises drive mechanism including a receiver, a motor, wheels, and the like. Each RC car 200 also has its own ID being associated with the transmitter's ID. Each RC car 200 receives a radio wave signal in one of the transmission modes e1 to e4 corresponding to the ID, and comprehends the command signal in the received radio wave signal.

The structure of the transmitter 100 and the RC car 200 shown in FIG. 1 will now be described.

Figure 2:
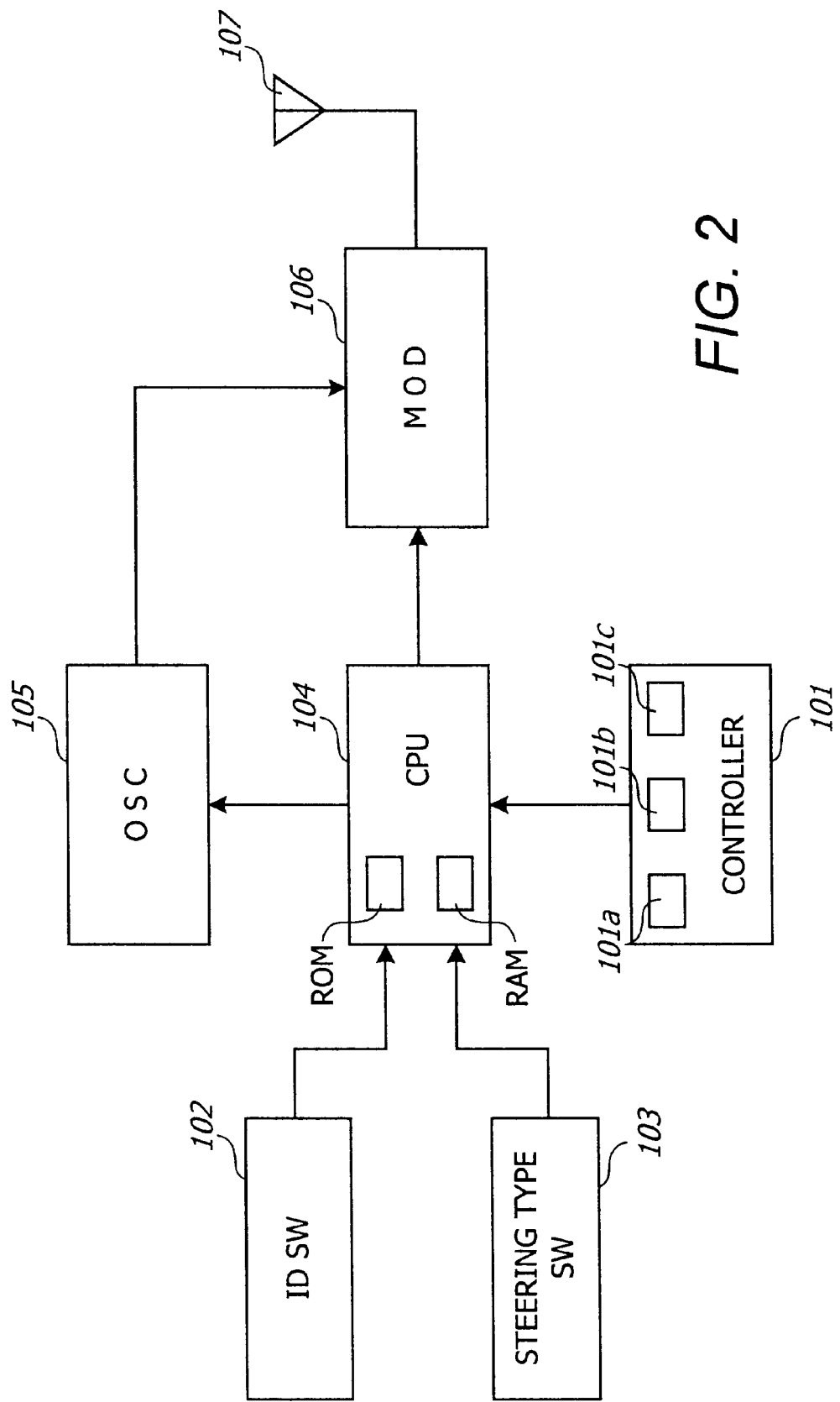
FIG. 2 is a block diagram showing the system structure of a transmitter.

FIG. 2 is a block diagram showing the system structure of the transmitter 100.

As shown in FIG. 2, the transmitter 100 comprises a controller set 101, an ID switch 102, a steering type switch 103, a CPU (Central Processing Unit) 104, an oscillator (OSC) 105, a modulator 106, and an antenna 107.

The controller set 101 is an input for inputting a command signal for controlling the RC car 200. The controller set 101 includes a steering controller 101a for controlling a steering mechanism, a drive controller 101b for controlling the powering motor, a sound switch 101c for controlling a sound unit which mimics a horn or exhaust notes, and the like.

The ID switch 102 is a 2-bit digital switch for setting any one of four combinations of 2-bit data, that is, "00", "01", "10", and "11" which represent the ID types (type 1 to type 4) respectively. In other words, the ID switch sets target identification information which specifies a target receiver. The ID type is determined by the manufacturer and assigned to each transmitter 100 during manufacturing process. The transmitter 100 has a visual mark representing which ID type is assigned thereto. For example, the ID types may be distinguished by color, and the transmitter 100 may be painted partially or fully by the color representing its ID type. Three or more bits data may be employed to indicate the ID type. The larger bit number allows more RC cars 200 to be controlled with one band.

There are two different steering mechanisms type A and type B. Type A drives left or right wheels in reverse when steering. Type B has a typical steering mechanism which directs at least one pair of left and right wheels. Both types require at least two motors on the RC car 200. For example, the RC car 200 employing type A has a right motor (R-motor) to drive right wheel(s) and a left motor (L-motor) to drive left wheel(s), while the RC car 200 employing type B has a steering motor (S-motor) to move the steering mechanism and a wheel drive motor (W-motor) to drive the wheels.

The steering type switch 103 is a switch for setting the steering type A or B. In other words, the steering switch 103 sets steering specifying information. The steering type is determined by the manufacturer and assigned to each transmitter 100 during manufacturing process. The type switch 103 is, for example, a jumper line or the like on a printed wiring board on which electronic components are mounted.

The CPU 104 is a single chip microcomputer having a ROM for storing a program and a RAM as a work area. The CPU 104 receives data from the controller set 101, the ID switch 102, and the steering type switch 103 through appropriate ports, and store the received data in the RAM. The CPU 104 executes the program in the ROM, and controls the transmitter 100 in accordance with the running program. The CPU 104 selects appropriate transmission mode in accordance with the ID type indicated by the ID switch 102, and converts the target ID information (ID type) indicated by the ID switch 102 and the command signal input by the controller set 101 into a modulation signal (a signal for modulating the carrier wave signal). In this case, the target ID information and the command signal are compressed along a time sequence before the modulation, as preparation for intermittent transmission.

The oscillator (OSC) 105 comprises a quartz oscillation module which oscillates in accordance with an oscillation control signal from the CPU 104. The oscillator 105 generates a carrier wave signal in accordance with one of the twelve sub bands. The oscillation module in each of four transmitters 100 shown in FIG. 1 provides the same frequency, that is, generated carrier wave signals have the same frequency.

The modulator 106 modulates the carrier wave signal generated by the oscillator 105 by the modulation signal supplied from the CPU 104. Then, the CPU 104 transmits the modulated carrier wave signal, that is, a radio wave signal representing the target identification information and the command signal through the antenna 107.

Figure 3:
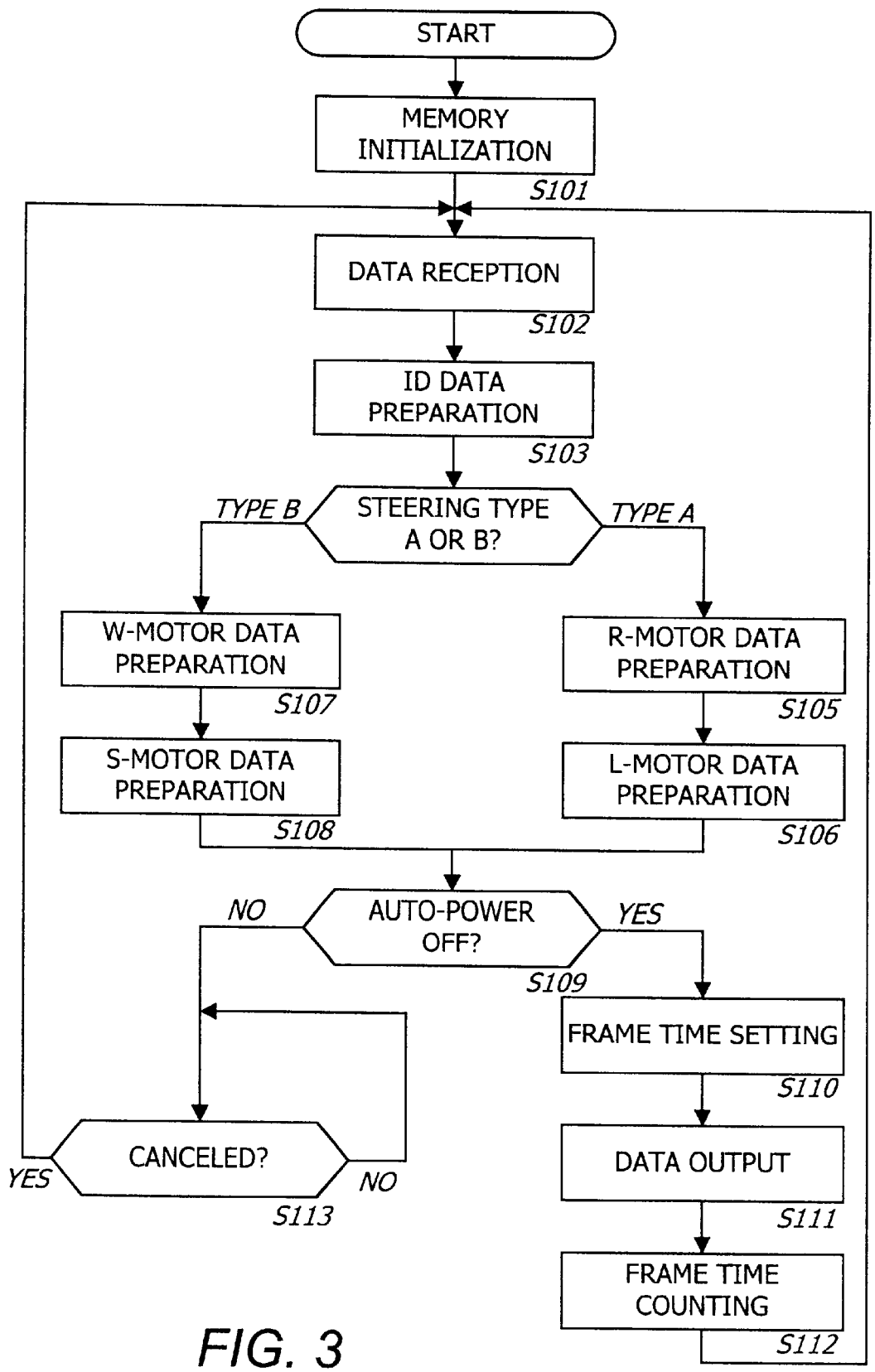
FIG. 3 is a flowchart for explaining steps executed by a CPU in the transmitter.
Figure 4:
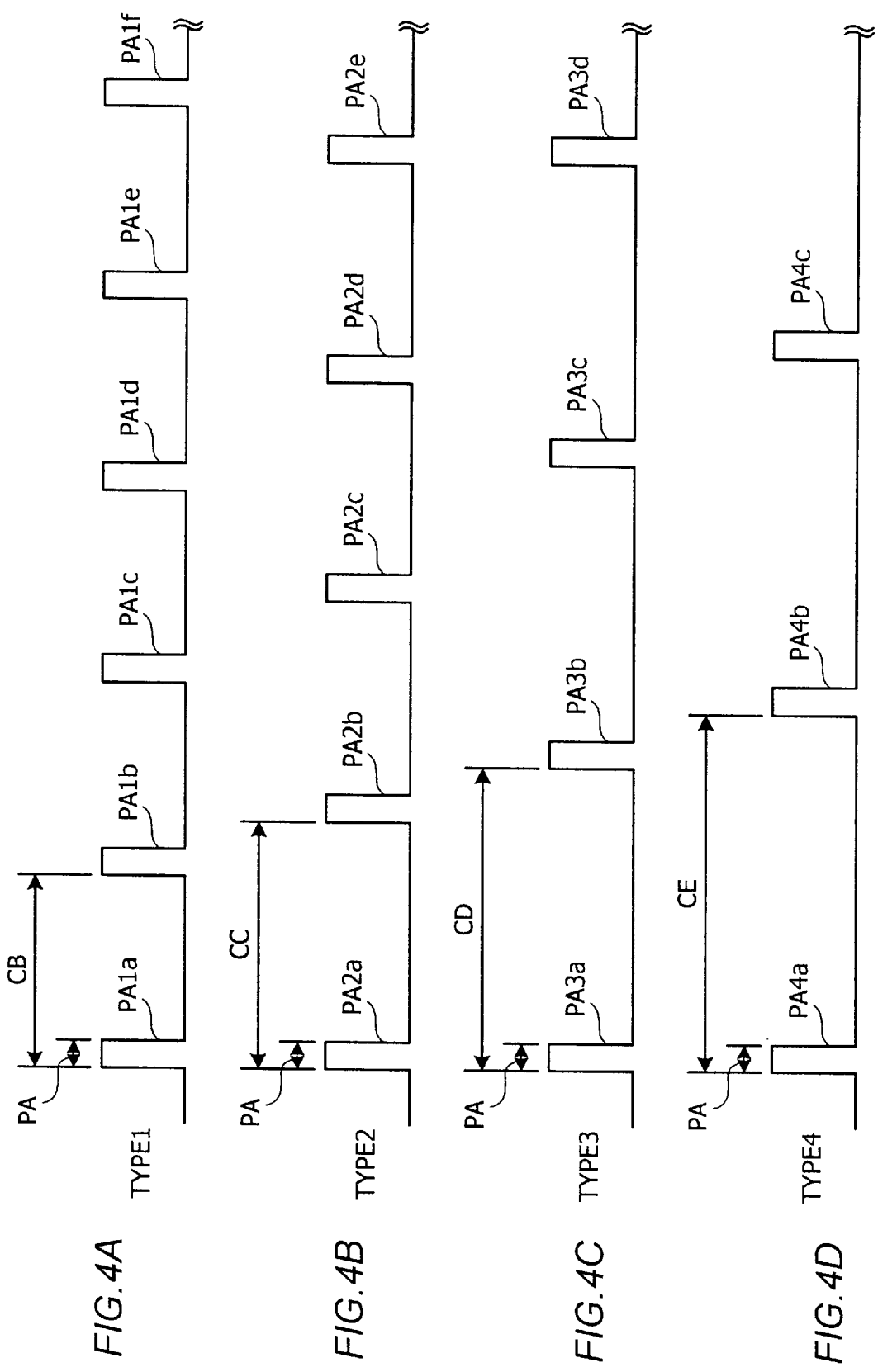
FIGS. 4A to 4D are timing charts for explaining transmission timings of four different transmission modes.

An operation of the transmitter 100 will now be described with reference to a flowchart shown in FIG. 3 which indicate steps executed by the CPU 104.

The CPU 104 initialize the memory (RAM) at a first step (step S101), and executes the following loop processing.

The CPU 104 receives data from the controller set 101, the ID switch 102, and the steering type switch 103 through appropriate ports (step S102).

The CPU 104 prepares ID data (step S103). In this step, the CPU 104 selects appropriate transmission mode whose cycle (called "frame time") corresponds to the ID data supplied from the ID switch 102. In this case, four transmission modes corresponding to four different cycles are prepared for intermittent transmission.

FIGS. 4A to 4D show four transmission modes prepared for intermittent transmission at four different cycles. Period PA is a term for transmitting the command signal and the ID information (it is common to all types). Type 1 to type 4 have cycles CB to CE respectively. Lengths of cycles CB to CE are determined based on the period PA and different prime numbers. For example, cycle CB=75×PA, cycle CC=97×PA, cycle CD=11×PA, and cycle CE=13×PA. This configuration helps to avoid periods PA from appearing simultaneously. The command signal and the ID information have been compressed along time sequence so as to fit the length of the period PA, During any periods other than the periods PA, no carrier wave signal or a very low level carrier wave signal is transmitted. Regardless of the ID type, the command signal is transmitted twice sequentially for data confirmation in the RC car 200.

Figure 5:
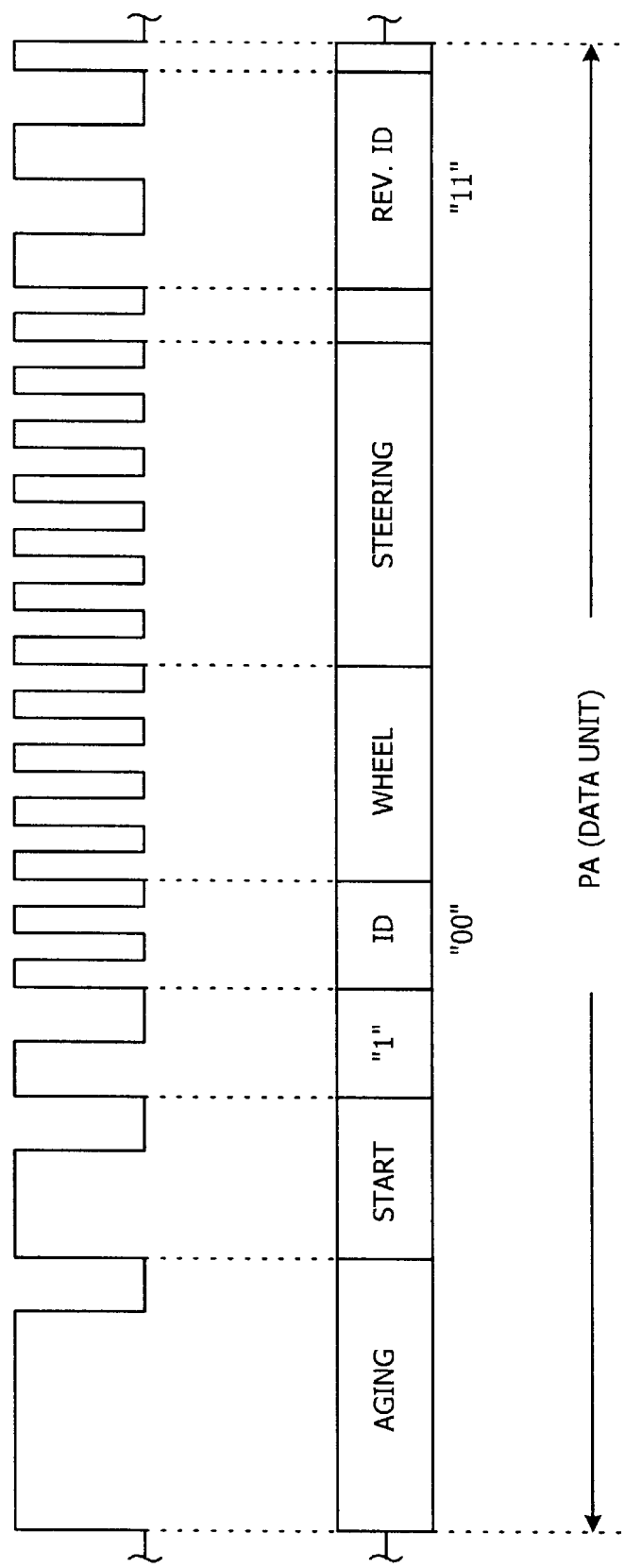
FIG. 5 is a diagram showing data format in a data transmission period relating to a transmission mode shown in any one of FIGS. 4A to 4D.

FIG. 5 is a timing chart showing a detailed data unit being transmitted during a period PA (where steering type B and arbitrary ID type).

A period of "AGING" is a period for preparation where the oscillator 105 is activated to generate a carrier wave signal. The following "START" period contains data as start bit represented by a high-level signal and a low-level signal which are shared with predetermined time ratio. Then, data representing "1" follows before the 2-bit ID data (in this case, "00"). The command signal set ("WHEEL" and "STEERING") follows to the ID data. Following to the command signal are data representing "0" and reversed ID data "REV. ID" (in this case, "11"). Further, the command signal, that is, a data set from "START" to "REV. ID" is transmitted twice.

At step S104 (FIG. 3), it is determined whether the steering type of the RC car 200 is type A or B. In case of type A, data for the R-motor and the L-motor are prepared (steps S105, S106). In case of type B, data for the W-motor and the S-motor are prepared (steps S107, S108).

Since the data unit shown in FIG. 5 is for the steering type B, the command signal therein represents the data for the W-motor ("WHEEL") and for the S-motor ("STEERING"). In a case where the sound switch for controlling sounds such as horn sound or exhaust notes is operated, sound data is prepared after preparation of the motor data.

After the motor data preparation, it is determined whether "auto power-off" function is activated or not (step S109). The auto power-off function is effective in power saving when the controller(s) 101 is kept on activating. In such a case, the auto power-off function automatically turns off the transmitter 100 to cut power to the transmitter 100 and the RC car 200 thus protect the motor on the RC car 200. In step S109, it is determined whether a time period where the controller(s) 101 is kept on activating excess a predetermined period of time or not.

If the auto power-off function is not set, frame time setting is executed (step S110) to output (transmit) the data (step S111). At this step, the command signal is transmitted twice. Then, the CPU 104 counts time for the set frame time (step S112). After the frame time counting is completed, that is, the predetermined time period set for the frame lapses, the flow returns to step S102 to receive the next data.

If it is determined at step S109 that the auto power-off function is set, the transmitter 100 is automatically turned off. Then, the CPU 104 determines whether the auto power-off function is canceled or not (step S113). When the auto power-off function is canceled, the flow returns to step S102 to receive the next data.

Figure 6:
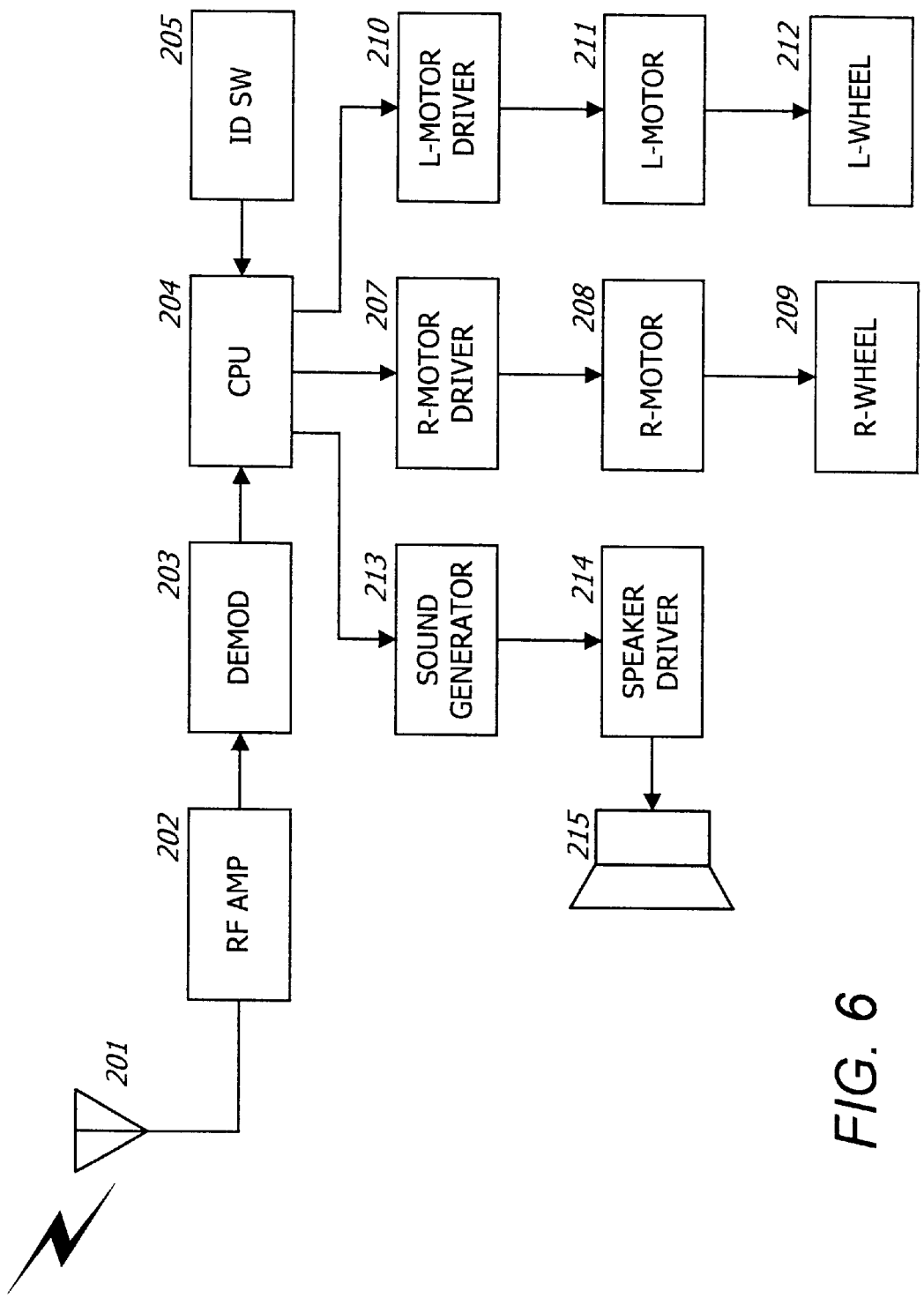
FIG. 6 is a block diagram showing the system structure of an RC car employing steering type A.

FIG. 6 is a block diagram showing the system structure of the RC car 200 employing the type A steering mechanism.

As shown in FIG. 6, the RC car 200 comprises an antenna 201, a radio frequency amplifier (RF AMP) 202, a demodulator (DEMOD) 203, a CPU (Central Processing Unit) 204, an ID switch 205, an R-motor driver 207, an R-motor 208, right wheels (R-WHEEL) 209, an L-motor driver 210, an L-motor 211, left wheels (L-WHEEL) 212, a sound generator 213, a speaker driver 214, and a speaker 215.

The antenna 201 receives the radio wave signal being transmitted by the transmitter 100. The RF AMP 202 is a specific sub band amplifier which amplifies only a specific sub band of 12 sub band, and comprises an adjustable oscillator (not shown) for tuning to desired sub band. A set of the antenna 201 and the RF AMP 202 forms reception means for receiving the radio wave signal assigned to a specific sub band.

The DEMOD 203 amplifies the reception signal supplied from the RF AMP 202, and demodulate the modulation signal embodied in the received carrier wave signal to extract the command signal input by the controllers 101 and the ID for identifying the target receiver.

The CPU 204 is a single-chip microcomputer including a ROM for storing a program and a RAM as work area. The CPU 204 decompresses the extracted command signal and the ID information supplied from the DEMOD 203 along time sequence, that is, restores the data, and transfer the decompressed data to the RAM. The CPU 204 executes the program in the ROM and controls the RC car 200 in accordance with the running program.

The ID switch 205 is a 2-bit digital switch which indicates 2-bit digital data "00", "01", "10", or "11" which represents the ID type of the RC car 200. The ID switch 205 designates receiver ID information. As well as the case of the ID switch 102 in the transmitter 100, the ID type is determined by the manufacturer, and appropriate ID type is set to the ID switch 205 during the manufacturing process. Similar to the transmitter 100, the RC car 200 is painted partially or fully by a color which indicates the assigned ID type.

The CPU 204 determines whether the ID information extracted from the received signal by the DEMOD 203 coincides with the ID information designated by the ID switch 205, to discriminate whether the received command signal is targeting the RC car 200 concerned. That is, if the received ID information coincides with the ID information designated by the ID switch 205, the CPU 104 sends the extracted command signal to appropriate motor drivers. More precisely, if the extracted command signal represents movement of the right wheels 209, the CPU 204 supplies the command signal to the R-motor driver 207. If the extracted command signal represents movement of the left wheels 212, the CPU 204 supplies the command signal to the L-motor driver 210.

The R-motor driver 207 converts the command signal for the R-motor supplied from the CPU 204 into a drive signal, and supplies it to the R-motor 208 in order to drive the right wheels 209. The L-motor driver 210 converts the command signal for the L-motor data supplied from the CPU 204 into a drive signal, and supplies it to the L-motor 211 in order to drive the left wheels 212.

If the command signal includes sound data, the CPU 204 supplies extracted sound data to the sound generator 213. The sound generator 213 converts the sound data into an audio signal, and supplies it to the speaker driver (amplifier) 204 in order to output horn sound or exhaust notes through the speaker 215.

Figure 7:
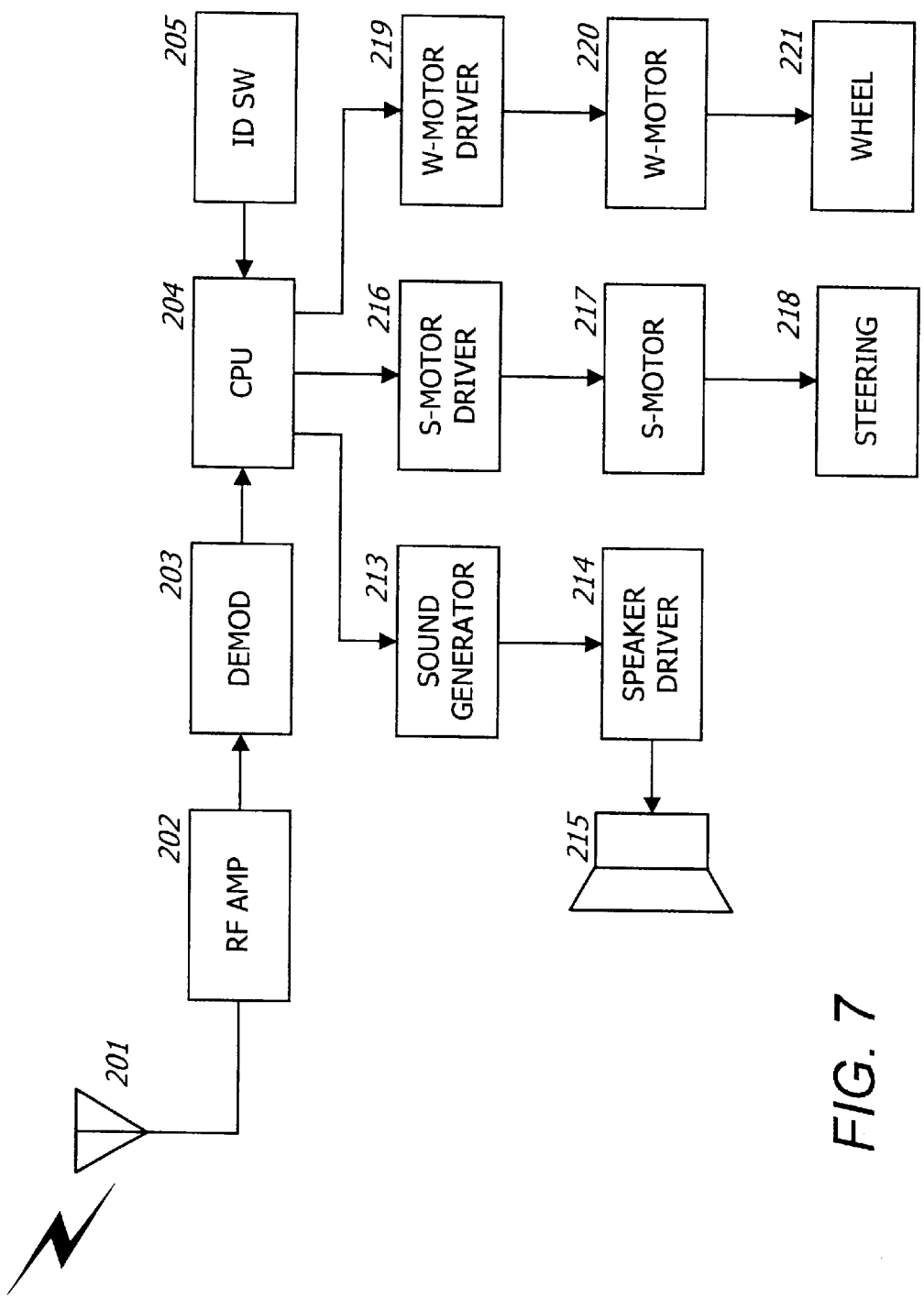
FIG. 7 is a block diagram showing the system structure of an RC car employing steering type B.

FIG. 7 is a block diagram showing the system structure of the RC car 200 employing type B steering mechanism. Like or same reference numerals as used in FIG. 6 are also used in FIG. 7 to denote corresponding or identical components.

In FIG. 7, a steering motor driver (S-motor driver) 216 converts the command signal for an S-motor supplied from the CPU 204 into a drive signal, and supplies it to the S-motor 217 to drive a steering mechanism 218. A wheel motor driver (W-motor driver) 219 converts the command signal for a W-motor supplied from the CPU 204 into a drive signal, and supplies it to the W-motor 220 in order to drive a drive mechanism 221.

Figure 8:
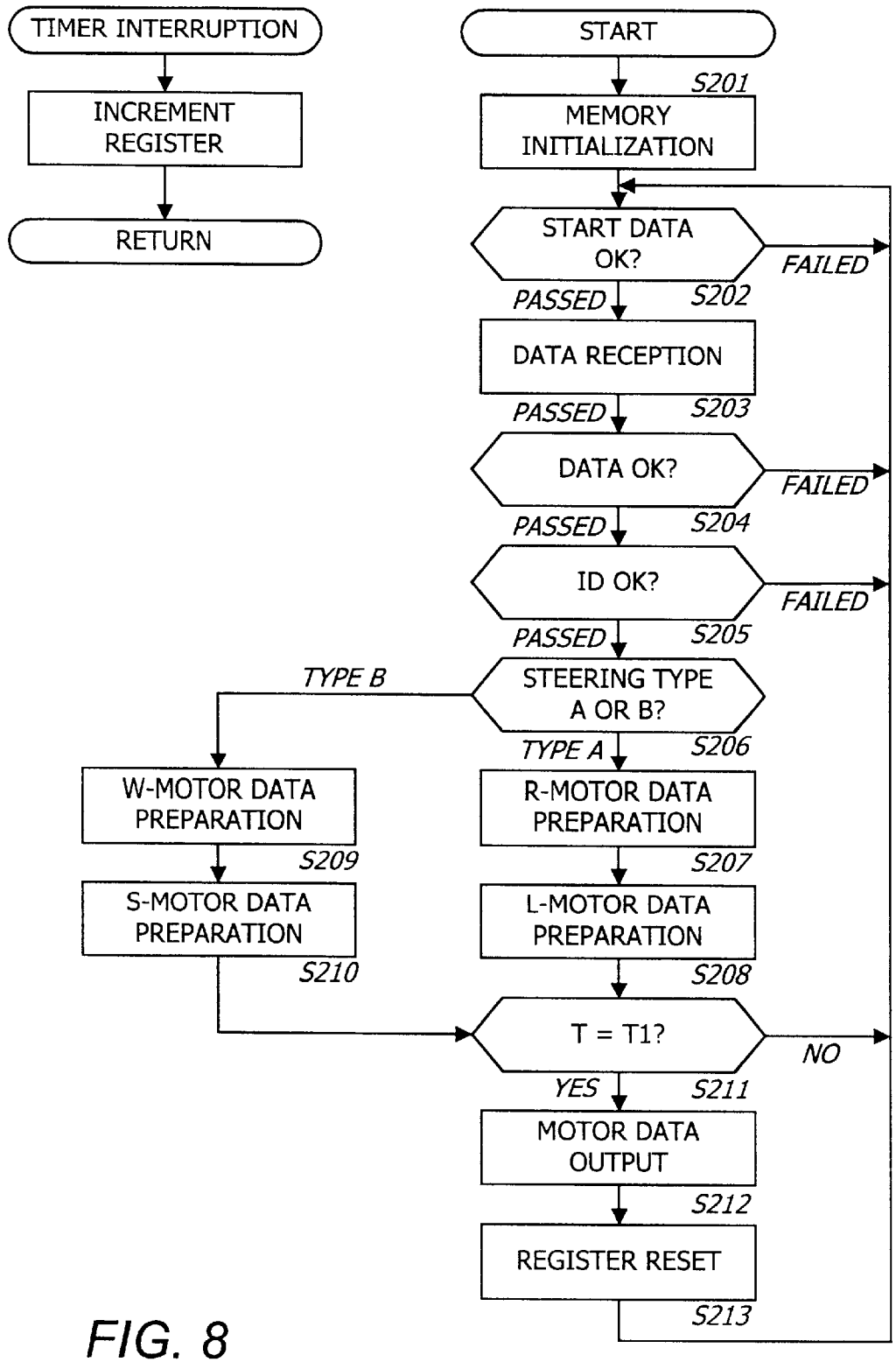
FIG. 8 is a flowchart for explaining an operation of the RC car.

Operations of the RC car 200 will now be described with reference to a flowchart shown in FIG. 8 which shows steps to be executed by the CPU 204.

After the memory (RAM) initialization (step S201), the CPU 204 executes the following loop processing.

The CPU 204 looks for the start bit in the received radio wave signal (step S202). That is, the CPU 204 attempts to detect the data represented by "START" shown in FIG. 5. If the CP+U 204 fails to detect the start bit (FAILURE), the attempt is repeated until successful detection. When the CPU 204 detects the start bit (SUCCESSFUL), the CPU 204 obtains the data following to the start bit and transfer them to the RAM (step S203).

Since the transmitter 100 transmits the data twice as aforementioned, the CPU 204 obtains the data twice (not shown in FIG. 8), then the CPU 204 checks the data (step S204). More precisely, the CPU 204 checks whether a set of data representing "1" and ID following to the start bit and a following set of data representing "0" and REV. ID are reversed each other correctly. Moreover, the CPU 204 checks whether primary arrived data unit coincides with the secondary one.

If no data matching is found (ERROR), the flow returns to step S202 to do another session for start bit detection. If the data is correct (PASS), the CPU 204 then checks the ID (step S205). That is, the CPU 204 discriminates whether the ID data in the received data unit coincides with the ID data indicated by ID switch 205. If the ID data are unmatched (FAILURE), the flow returns to step S202 to do another session for start bit detection because the received command signal targets another RC car 200.

If the ID data are matched (PASS), the CPU 204 determines the steering type (step S206). The CPU 204 analyzes the received command signal to determine whether the steering type is A or B. In case of type A, the CPU 204 settles output control of the R- and L-motors (steps S207, S208). In case of type B, the CPU 204 settles output control of the W- and S-motors (steps S209, S210).

After the motor output controls are settled, the CPU 204 discriminates whether timer register value T in the RAM reaches a predetermined value T1 (step S211). The timer-register value T is incremented at every timer interruption.

When it is before T=T1, the flow returns to step S202 to do another session for start bit detection. If the timer register value T has reached T1, the CPU 204 supplies the motor output control data to appropriate motor drivers (step S212). Then, the CPU 204 resets the timer register (step S213), and shifts to another session for start bit (step S201).

According to the above embodiment, a plurality of control targets corresponding to one of sub bands are distinguished by ID, and different radio wave signals representing command signal each corresponding to different ID but all corresponding to one sub band are prepared. This structure allows plural target receiver control with one sub band. For example, in a case where a band is divided into 12 sub bands, 48 RC cars 200 in total (=4 bands×12 sub bands) can be controlled simultaneously. If the system employs three or more bits data for ID, the number of controllable RC cars 200 increase.

The transmission modes differ from each other by different cycles for intermittent transmission, and the transmitter 100 selects an appropriate transmission mode which corresponds to cycle in accordance with the ID. This structure helps to transmit the command signal at a timing not being synchronous with another transmission in the same sub band by the other transmitter 100, therefore, the RC car 200 is likely to successfully receive the command signal directing thereto, even if other transmitters 100 are transmitting the same sub band radio wave signals.

Moreover, the transmitter 100 compresses the command signal and the target ID information before converting them into the modulation signal. The data compression is helpful to perform efficient intermittent transmission.

The transmitter 100 sets steering type information which designates steering type of the target receiver, and converts the command signal into the modulation signal in accordance with the set steering type information. Therefore, the transmitter 100 is compatible with different steering types.

The RC car 200 converts the received command signal into the drive signal in accordance with the steering type information included in the extracted command signal. According to this structure, a switch or the like on the RC car 200 which selects steering type is unnecessary.

In the above embodiment, the command signal is transmitted twice. However, single transmission may be applicable if secure data confirmation can be established by checking the ID data and rev. ID data once. Or, the transmitter 100 may be equipped with a switch for selecting single transmission or transmission twice, thus allowing a user to have option according to circumstances.

Although the ID for both transmitter 100 and RC car 200 is previously determined by the manufacturer by setting the ID switches 102 and 205 in the above embodiment, user changeable ID configuration may be applicable. In other words, the target ID information and the receiver ID information may be changeable according to circumstances, by the user's operation through the transmitter 100 and the RC car 200. This structure allows the user to have option of choosing suitable ID configuration according to circumstances. This is effective in avoiding ID conflict in case of simultaneous control of plural RC cars 200 with the same sub band.

In this case, the system may comprise ID indicator. For example, the indicator may be various color LED wherein the colors are distinguished by ID sets. Or, the indicator may indicate ID by sound. For example, different tone sound sets for horn or exhaust note are prepared ID by ID.

Application of the radio control system according to the present invention is not limited to the RC car. The present invention is applicable to not only various radio controlled model ship or air plane, but also various industrial robots such as a carrier robot in a factory and a washing robot for building windows, and other various applications. Instead of the radio wave signal as the carrier wave, an infrared signal may be applicable to the present invention. In case of infrared communication, since intermittent transmission forms a pulse waveform infrared signal, the receiver may comprise a filter to extract only the infrared signal. In this case, the filter is also effective in canceling noises caused by sunlight or other lights.

According to the present invention, a plurality of target receivers which are controlled with radio wave signals corresponding to one sub band resulting from dividing a frequency band, are distinguished by ID, and carrier wave signals representing command signal are prepared so as to correspond to the sub band but differs from each other by ID. As a result, the plural target receives are controllable with one sub band.

What is claimed is:

1. A radio control system having pluralities of transmitters and receivers, wherein each of said transmitters comprises:
 input means for inputting a command signal in accordance with the user's operation;
 target designation means for designating target ID information which specifies a target receiver;
 mode select means for selecting one of plural transmission modes in accordance with the target ID information; and
 transmission means for transmitting a radio wave signal representing the target ID information and the command signal in accordance with the selected transmission mode, each of said receivers comprises:
 drive means for receiving the radio wave signal;
 receiver designation means for designating receiver ID information which specifies said receiver itself;
 extraction means for extracting the target ID information and the command signal from the radio wave signal received by said reception means; and
 signal conversion means for discriminating whether the extracted target ID information coincides with the receiver ID information, and for converting the extracted command signal into a drive signal if the coincidence is found; and
 drive control means for driving said drive means in accordance with the drive signal;
 wherein said transmission mode designates a cycle for intermittent transmission which differs in accordance with the target ID information, the cycles for intermittent transmissions for different ID information are different with each other, length (CB,CC,CD,CE) of the cycle for each of the intermittent transmission is determined as a product of a predetermined period (PA) and a prime number (5, 7, 11, 13 . . . ), the predetermined period is common to the different ID information, and said transmission means transmits the modulation signal during the predetermined period.

2. The system according to claim 1, wherein said second signal conversion means converts the extracted command signal into the drive signal in accordance with the drive type information included in the command signal.

3. A radio control system having pluralities of transmitters and receivers, wherein each of said transmitters comprises:
 carrier wave generation means for generating a carrier wave signal corresponding to one of plurality frequency bands;
 input means for inputting a command signal in accordance with the user's operation;
 target designation means for designating target ID information which specifies a target receiver;
 mode select means for selecting one of plural transmission modes in accordance with the target ID information;
 first signal conversion means for converting the target ID information and the command signal into a modulation signal in accordance with the selected modulation signal; and
 transmission means for transmitting a radio wave signal resulting from modulating the carrier wave signal by the modulation signal, said each of said receiver comprises:
 drive means for movably driving said receiver;
 reception means receiving a radio wave signal corresponding to one of plural frequency bands;
 receiver designation means for designating receiver ID information which identifies said receiver itself;
 demodulation means for demodulating the radio wave signal received by said reception means to extract the target ID information and the command signal;
 second signal conversion means for converting the extracted command signal into a drive signal when the extracted target ID information coincides with the receiver ID information; and
 drive control means for controlling said drive means in accordance with the drive signal;
 wherein said transmission mode designates a cycle for intermittent transmission which differs in accordance with the target ID information, the cycles for intermittent transmissions for different ID information are different with each other, length (CB,CC,CD,CE) of the cycle for each of the intermittent transmission is determined as a product of a predetermined period (PA) and a prime numbers (5, 7, 11, 13 . . . ), the predetermined period is common to the different ID information, and said transmission means transmits the modulation signal during the predetermined period.

4. The system according to claim 3, wherein said first signal conversion means compresses the command signal and the target ID information before carrying out the signal conversion.

5. The system according to claim 3, wherein said target designation means outputs drive type information which designates a type of said drive means of the target receiver, and said first signal conversion means converts the command signal into the modulation signal in accordance with the drive type information.

6. The system according to claim 3, wherein said target designation means and said receiver designation means are operable by a user to designate the target ID information and the receiver ID information.

7. A radio control method comprising the steps of:
inputting a command signal in accordance with the user's operation;
designating target ID information which specifies a target receiver;
selecting one of plural transmission modes in accordance with the target ID information;
transmitting a radio wave signal representing the target ID information and the command signal;
receiving the radio wave signal whose transmission mode corresponds to receiver ID information assigned to a receiver, and extracting the target ID information and the command signal included in the received radio wave signal;
converting the extracted command signal into a drive signal when the extracted target ID information coincides with the receiver ID information; and
executing actions in accordance with the drive signal;
wherein said transmission mode designates a cycle for intermittent transmission which differs in accordance with the target ID information, the cycles for intermittent transmissions for different ID information are different with each other, length (CB,CC,CD,CE) of the cycle for each of the intermittent transmission is determined as a product of a predetermined period (PA) and a prime number (5, 7, 11, 13 . . . ), the predetermined period is common to the different ID information, and in said transmission step the modulation signal is transmitted during the predetermined period.

8. A radio control method comprising the steps of:
generating a carrier wave signal corresponding to one of plural frequency bands;
inputting a command signal in accordance with the user's operation;
designating target ID information which specifies a target receiver;
selecting one of plural transmission modes in accordance with the target ID information;
converting the target ID information and the command into a modulation signal in accordance with the selected transmission mode;
modulating the carrier wave signal by the resultant modulates signal to embody the target ID information and the command signal in a radio wave signal, and transmitting the radio wave signal;
receiving the radio wave signal corresponding to a specific frequency band;
designating receiver ID information which identifies a receiver;
demodulating the received radio wave signal to extract the target ID information and the command signal;
converting the extracted command signal into a drive signal when the extracted target ID information coincides with the receiver ID information; and
driving said target receiver in accordance with the drive signal;
wherein said transmission mode designates a cycle for intermittent transmission which differs in accordance with the target ID information, the cycles for intermittent transmissions for different ID information are different with each other, length (CB,CC,CD,CE) of the cycle for each of the intermittent transmission is determined as a product of a predetermined period (PA) and a prime number (5, 7, 11, 13 . . . ), the predetermined period is common to the different ID information, and in said transmission step the modulation signal is transmitted during the predetermined period.

9. The method according to claim 8, wherein said step of converting the extracted command signal converts the extracted command signal into the drive signal in accordance with the drive type information included therein.

10. The method according to claim 8, wherein said step of converting the command signal and the target ID information compresses the command signal and the target ID information before the conversion.

11. The method according to claim 8, wherein said target ID information designating step outputs drive type information which designates drive type of the target receiver, and
said step of converting the command signal converts the command signal in accordance with the set drive type information.

12. The method according to claim 8, wherein said steps of designating the target ID information and the receiver ID information designate the target ID information and the receiver ID information in accordance with the user's operation.

13. A transmitter for a radio control system having a plurality of transmitters and receivers assigned to said transmitters respectively, comprising:
input means for inputting a command signal in accordance with the user's operation;
target designating means for designating target ID information which specifies a target receiver;
mode select means for selecting one of plural transmission modes in accordance with the target ID information; and
transmission means for transmitting a radio wave signal representing the target ID information and the command signal, in accordance with the selected transmission mode;
wherein said transmission mode designates a cycle for intermittent transmission which differs in accordance with the target ID information, the cycles for intermittent transmissions for different ID information are different with each other, length (CB,CC,CD,CE) of the cycle for each of the intermittent transmission is determined as a product of a predetermined period (PA) and a prime number 5, 7, 11, 13 . . . ), the predetermined period is common to the different ID information, and in said transmission step the modulation signal is transmitted during the predetermined period.

14. A receiver for a radio control system having pluralities of transmitters and receiver, comprising:
drive means for movably drives said receiver;
reception means for receiving a radio wave signal;
receiver designation means for designating receiver ID information which identifies said receiver itself;
demodulation means for extracting target ID information and a command signal included in a radio wave signal received by said reception means;
signal conversion means for discriminating whether the extracted target ID information coincides with the receiver ID information, and for converting the extracted command signal into a drive signal when the coincidence is found; and drive control means for controlling said drive means in accordance with the drive signal;

wherein said transmission mode designates a cycle for intermittent transmission which differs in accordance with the target ID information, the cycles for intermittent transmissions for different ID information are different with each other, length (CB,CC,CD,CE) of the cycle for each of the intermittent transmission is determined as a product of a predetermined period (PA) and a prime number (5, 7, 11, 13 . . . ), the predetermined period is common to the different ID information, and in said transmission means transmits the modulation signal is transmitted during the predetermined period.

15. A controller for a radio control system having pluralities of transmitters and receivers, comprising:

carrier wave generation means for generating a carrier wave signal corresponding to one of plural frequency bands;

input means for inputting a command signal in accordance with the user's operation;

target designation means for designating target ID information which specifies a target receiver;

mode select means for selecting one of plural transmission modes in accordance with the target ID information;

signal conversion means for converting the target ID information and the command signal into a modulation signal in accordance with the selected transmission mode; and transmission means for transmitting a radio wave signal resulting from modulating the carrier wave signal by the modulation signal;

wherein said transmission mode designates a cycle for intermittent transmission which differs in accordance with the target ID information, the cycles for intermittent transmissions for different ID information are different with each other, length (CB,CC,CD,CE) of the cycle for each of the intermittent transmission is determined as a product of a predetermined period (PA) and a prime number (5, 7, 11, 13 . . . ), the predetermined period is common to the different ID information, and said transmission means transmits the modulation signal during the predetermined period.

* * * * *